Aug. 5, 1969 F. G. KELLY ET AL 3,459,999

CIRCUIT MODULE AND ASSEMBLY

Filed July 3, 1967 2 Sheets-Sheet 1

Franklin G. Kelly
Donald J. Acton
INVENTORS

BY Jerry A. Dinardo
AGENT

CIRCUIT MODULE AND ASSEMBLY

Filed July 3, 1967 2 Sheets-Sheet 2

Franklin G. Kelly
Donald J. Acton
INVENTORS

BY Jerry A. Dinardo

AGENT

United States Patent Office 3,459,999
Patented Aug. 5, 1969

3,459,999
CIRCUIT MODULE AND ASSEMBLY

Franklin G. Kelly, Long Beach, and Donald J. Acton, Los Angeles, Calif., assignors to TRW Inc., Redondo Beach, Calif., a corporation of Ohio Filed July 3, 1967, Ser. No. 650,729
Int. Cl. H02b *1/04, 9/00;* H05k *1/00*
U.S. Cl. 317—101 7 Claims

ABSTRACT OF THE DISCLOSURE

A number of integrated circuits are embedded in a circuit board to form a circuit module. The circuit board is provided with a multiplicity of holes that pierce the circuit leads and expose portions of the leads. The holes and leads are coated with conductive material. Output leads are attached along an edge of the board so that they extend beyond the edge in the plane of one of the board surfaces. Conductors printed on both sides of the board interconnect the output leads and the integrated circuit leads through the conductively coated holes.

A number of the above circuit modules are arranged in a closely packed parallel array between two insulative mounting panels to form a circuit module assembly with the output leads pointing alternately in one and then the other of two opposite directions. The output leads extend through holes in the mounting panels and are interconnected by jumpers at their external ends. A defective circuit module is readily removed by cutting the jumpered ends of the output leads. The removed module may be repaired and then easily replaced by jumpering the cut output leads.

Background of the invention

*Field of the invention.*—This invention relates to integrated circuit modules and assemblies and more particularly to improved structures that facilitate original manufacture as well as ready replacement of defective modules.

*Description of the prior art.*—Integrated circuit modules are usually assembled by stacking together circuit boards that contain the circuits and joining the circuit boards adhesively. A failure in one of the circuits cannot easily be rectified by the removal and replacement of the defective board, because of the adhesive bonding.

Summary of the invention

The foregoing difficulties of the prior art are overcome according to the invention by stacking integrated circuit boards in closely spaced but unbonded array, and by providing output leads extending only from one edge of the respective boards. The boards are arranged so that the output leads point alternately in one and then the other of two opposite directions. The output leads on both sides of the assembly are interconnected with jumper wires. A board containing a defective integrated circuit can be removed by cutting the leads under the jumper wires. After repair, the same board can be replaced and the shortened leads can be reconnected into the assembly.

In accordance with other features of the invention, a novel circuit module includes an insulative circuit board which contains a plurality of integrated circuits embeded therein. The circuit board is provided with a multiplicity of holes extending through opposing surfaces thereof, with a portion of each of the laterally extending leads of the integrated circuits disposed in a respective hole. Conductive coatings on the walls of the holes extend over the leads to make electrical contact therewith.

A plurality of mutually spaced output leads are attached to the circuit board in the vicinity of an edge thereof and extend parallel to each other beyond the edge and substantially coplanar with one of the opposing circuit board surfaces.

Circuit conductors printed on both sides of the board connect individual hole conductive coatings with individual output leads. These conductive connections may traveres one side only of the circuit board. Alternatively, they may traverse both sides of the circuit board by way of additional conductively coated holes that join a printed conductor on one side with a printed conductor on the other side.

Description of the preferred embodiments

Figure 1:
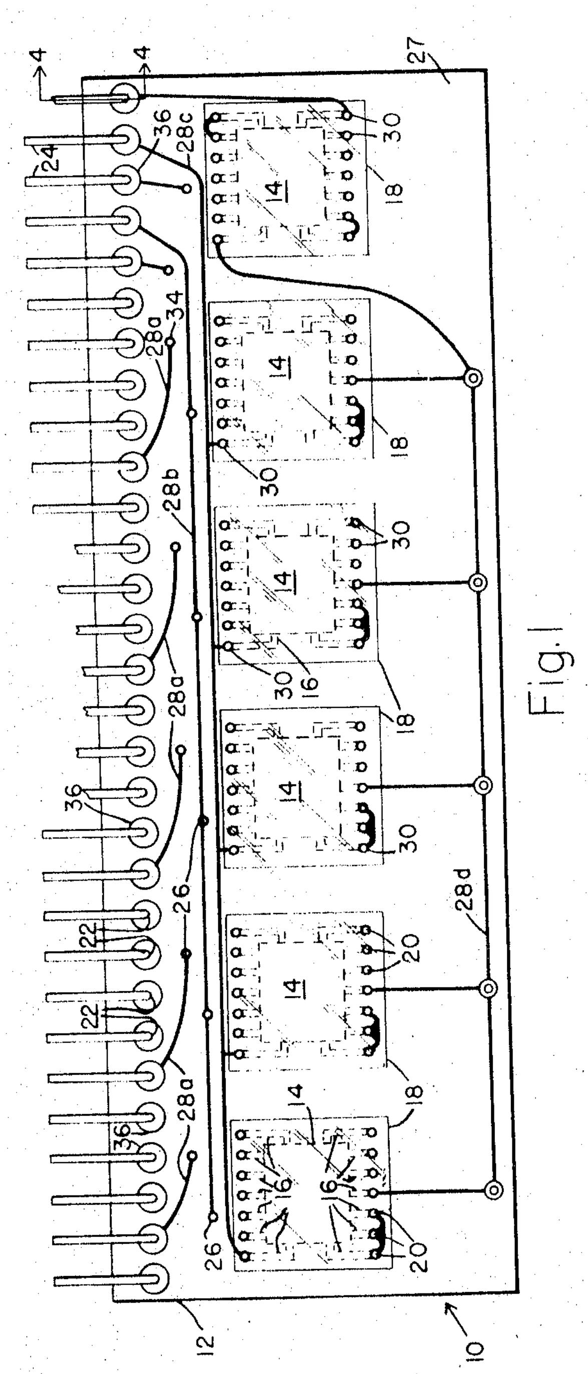
FIG. 1 is a top plan view of a circuit module according to the invention.
Figure 2:
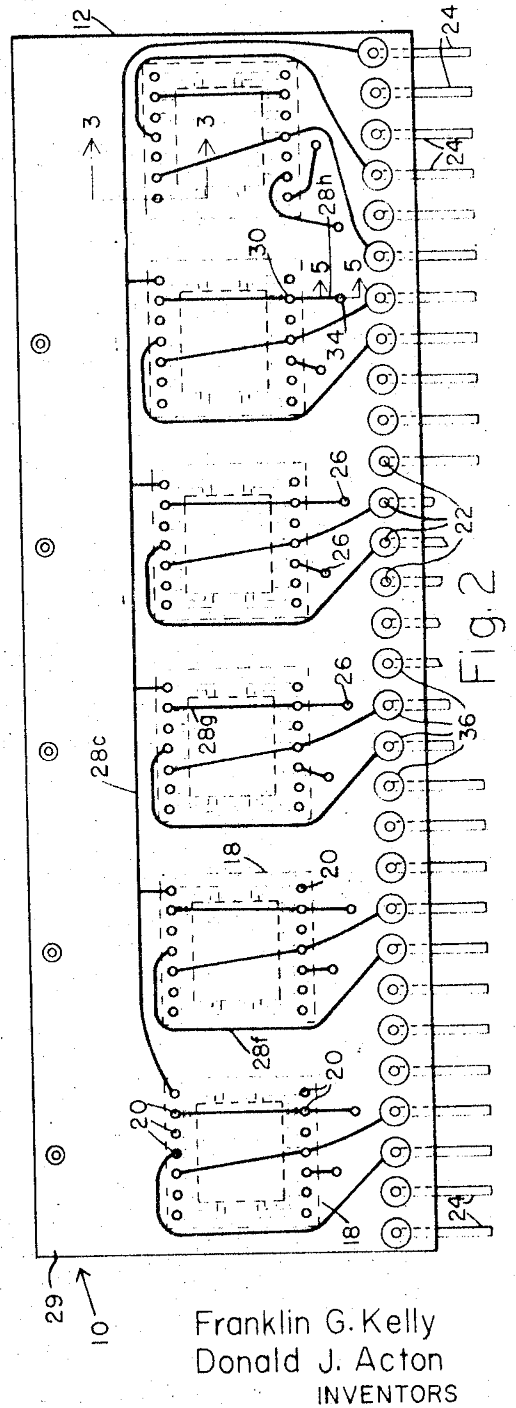
FIG. 2 is a bottom plan view of the circuit module of FIG. 1.

Referring to FIGS. 1 and 2, there is shown a circuit module 10 comprising an elongated insulation board 12 containing a number of integrated circuits 14 embeded in recesses therein. In the example shown there are six integrated circuits 14 arranged side by side along the length of the insulation board 12.

The insulation board may be made of epoxy, Fiberglas, or other appropriate rigid insulation material. The recesses in the insulation board 12 may be formed by mechanical, ultrasonic, or chemical removal operations. The integrated circuits 14, provided with laterally extending leads 16, may then be placed in the recesses, after which clear liquid epoxy 18 or other clear plastic material is poured in to mold the integrated circuits 14 in place in the insulation board 12.

After the epoxy 18 is cured, holes 20 are drilled through the epoxy 18 and the insulation board 12 piercing each lead 16 of the integrated circuits 14. A row of holes 22 is also drilled through the insulation board 12 adjacent one edge thereof for connecting L-shaped output leads 24, as will be further explained. Additional holes 26 are also drilled through the insulation board 12 to provide interconnections between the two sides of the board 12.

Figure 3:
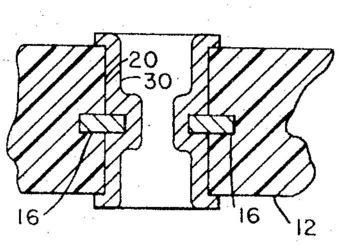
FIG. 3 is an enlarged sectional view taken along line 3—3 of FIG. 2.

The holes 20 that sever the integrated circuit leads 16 are then enlarged by chemically etching away the epoxy 18 and the material of the insulation board 12 so as to expose portions of the circuit leads 16, as shown in FIG. 3.

Figure 4:
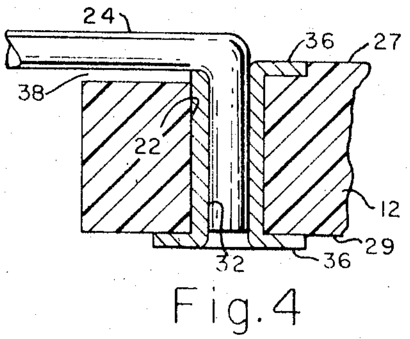
FIG. 4 is an enlarged sectional view taken along line 4—4 of FIG. 1.
Figure 5:
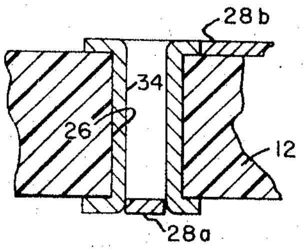
FIG. 5 is an enlarged sectional view taken along line 5—5 of FIG. 2.

Interconnecting conductors 28*a*, 28*b*, 28*c*, 28*d*, 28*e*, 28*f*, 28*g*, and 28*h* are then plated on both side surfaces 27 and 29 of the insulation board 12 by printed circuit techniques preferably utilizing photoresist methods. During the plating operation conductive coatings 30, 32, and 34 are also applied to the holes 20, 22, and 26 respectively, as shown in FIGS. 3, 4, and 5. The conductive coatings 30 extend over the projecting portions of the integrated circuit leads 16. During the plating operation, conductive rings 36 are applied on both surfaces of the insulation board 12 surrounding the holes 22 and contiguous with the coatings 32 therein.

After the plating operation, the L-shaped output leads 24 are soldered into the holes 22 and conductive rings 36 where external connections are to be made. The output leads 24, which are preferably stiff wires, are recessed in grooves 38 running from the holes 22 to the edge of the insulation board 12. The output leads 24 extend a substantial distance beyond the edge of the insulation board 12 and lie parallel to each other substantially in the plane of one side surface 27 of the insulation board 12.

As can be seen in the right hand portion of FIG. 1, some of the surface conductors, such as conductor 28c, connect between a hole conductive coating 30 and a conductive ring 36, thereby providing a direct conductive connection between an integrated circuit lead 16 and an output lead 24. Other surface conductors, such as conductor 28h (FIG. 2), connect between a hole conductive coating 30 and a hole conductive coating 34 on one side surface 29 of the insulation board 12. Conductive connection is made through the latter hole conductive coating 34 to another surface conductor on the opposite side surface 27, such as conductor 28a, that connects to a conductive ring 36 on the latter side surface 27.

In the foregoing manner, electrical connection may be made between the integrated circuits 14 and the output leads 24 either along surface conductors on only one side of the insulation board 12 or along surface conductors on both sides of the board 12 that are interconnected through the hole conductive coatings 34. Complex interconnection patterns may be accommodated by utilizing surface conductors on both sides of the insulation board 12.

Figure 6:
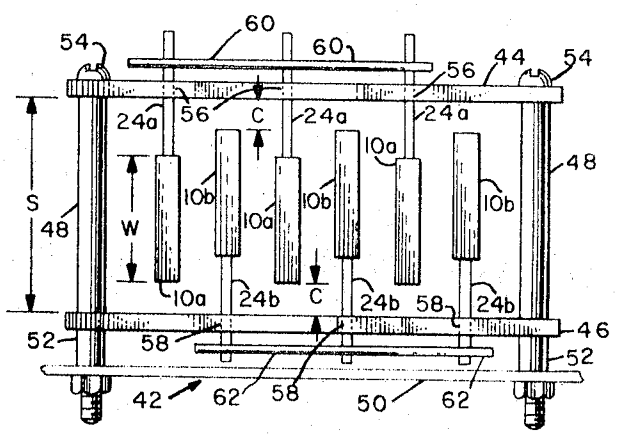
FIG. 6 is an elevation view of a module assembly according to the invention.
Figure 7:
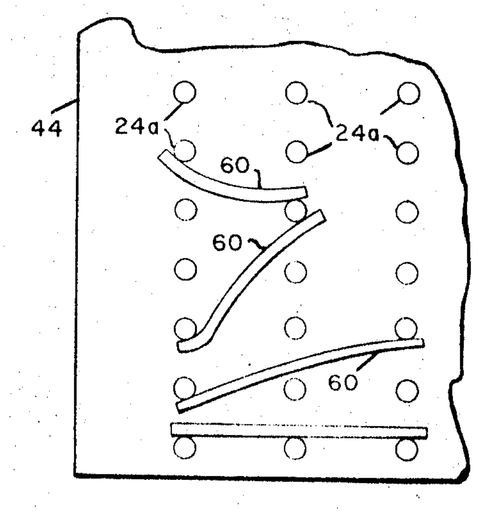
FIG. 7 is a fragmentary top plan view of the module assembly of FIG. 6.

Referring now to FIGS. 6 and 7, there is shown a module assembly 42 in which two groups of circuit modules 10a and 10b are arranged in spaced parallel array. The spacing between the modules 10a and 6 is shown exaggerated for ease in illustration. In actual practice, however, they are closely packed. The circuit modules 10a and 10b are disposed between two rectangular insulative mounting panels 44 and 46. The mounting panels 44 and 46 are separated at their corners by four tubular spacers 48, two being shown, and the bottom panel 46 is separated from a mounting plate 50 by four smaller tubular spacers 52. The module assembly 42 is secured to the mounting plate 50 by four bolts 54 passing through the tubular spacers 48 and 52.

The circuit modules 10a and 10b are spaced closely together in parallel fashion with their output leads 24a and 24b pointing alternately up in one direction and down in the opposite direction respectively. The output leads 24a pointing upwards pass through mounting holes 56 in the upper mounting panel 44, whereas the output leads 24b pointing downwards pass through mounting holes 58 in the lower mounting panel 46.

The first group of circuit modules 10a are interconnected by means of jumper wires 50 welded between the outer extremities of the output leads 24a. The second group of circuit modules 10b are likewise interconnected by means of jumper wires 62 welded between the outer extremities of the output leads 24b.

The spacing(s) between the mounting panels 44 and 46 is rather wide relative to the width (w) of the insulation boards of the circuit modules 10a and 10b. Accordingly, the portions of the output leads 24a extending beneath the upper mounting panel 44 are substantially longer than the tip portions projecting above the upper mounting panel 44. Likewise, the portions of the output leads 24b extending above the lower mounting panel 46 are substantially longer than the tip portions projecting beneath the lower mounting panel 46. Thus, in the event of a failure of one of the integrated circuits 14, the circuit modules 10a or 10b containing the defective circuit can be removed from the module assembly 42 by severing the output leads 24a or 24b just below the jumper wires 60 or 62. The defective circuit can be replaced and the repaired circuit modules may then be replaced in its former position by welding new jumper wires 60 or 62 across the tips of the shortened output leads. A sufficient spacing (c) is provided between the lead-less edge of the circuit module 10a or 10b and the adjacent mounting panel 44 or 46 to permit the insertion of output leads 24a or 24b through the mounting holes 56 or 58.

The embodiments of the invention in which an exclusive property or privilege is claimed are defined as follows:

1. A circuit module, comprising:
   (a) an insulative circuit board;
   (b) a plurality of integrated circuits embedded in said circuit board;
   (c) each integrated circuit including leads extending laterally therefrom;
   (d) said circuit board being formed with a multiplicity of holes extending through opposing surfaces thereof, with a portion of each of said leads disposed therein;
   (e) conductive coatings on the walls of said holes and in contact with said leads;
   (f) a plurality of mutually spaced output leads attached to said board in the vicinity of an edge thereof, extending parallel to each other beyond said edge, and substantially coplanar with one of said opposing surfaces;
   (g) and a plurality of conductors printed on said board and connecting individual ones of said conductive coatings with individual ones of said output leads.

2. The invention according to claim 1, wherein said circuit board contains printed conductors on both opposing sides thereof.

3. The invention according to claim 1, wherein said integrated circuits are arranged in a linear array.

4. The invention according to claim 1, wherein said circuit board is formed with a linear array of holes arranged parallel to said edge and extending normal to said opposing surfaces.

5. The invention according to claim 4, wherein said circuit board is formed with an array of grooves communicating with said linearly arrayed holes and in which a small portion of said output leads are disposed respectively.

6. A circuit module assembly comprising:
   (a) a pair of multi-apertured insulation boards;
   (b) means mounting said insulating boards in spaced apart, parallel relation;
   (c) a plurality of circuit boards mounted in closely spaced array between said insulation boards;
   (d) each of said circuit boards including a plurality of output leads attached to one edge thereof and protruding through the apertures of a respective one of said insualtion boards;
   (e) said circuit boards being arranged so that the output leads thereof protrude alternately through one of said insulation boards and then through the other one of said insulation boards;
   (f) a multiplicity of jumper wires interconnecting the ends of said output leads extending beyond said insulation boards;
   (g) the edges of said circuit boards that are opposite the edges to which said output leads are attached being free of output leads and being spaced alternately from said insulation boards to provide gaps therebetween;
   (h) the length of said output leads below said jumper wires and the length of said gaps being sufficient to permit ease in removal of a selected circuit board by severing the output leads thereof just below said jumper wires, and thereafter to permit the replacement of said selected circuit board in its same position with sufficient lengths of output leads for reconnection to jumper wires.

7. The invention according to claim 6, wherein each of said circuit boards contains integrated circuits.

References Cited

UNITED STATES PATENTS

| | | | |
|---|---|---|---|
| 2,862,992 | 12/1958 | Franz. | |
| 3,316,618 | 5/1967 | Guarracini | 339—17 XR |
| 3,247,575 | 4/1966 | Parstorfer. | |
| 3,193,731 | 7/1965 | Gerlach et al. | |

ROBERT K. SCHAEFER, Primary Examiner

J. R. SCOTT, Assistant Examiner

U.S. Cl. X.R.

339—17